Figure 1:
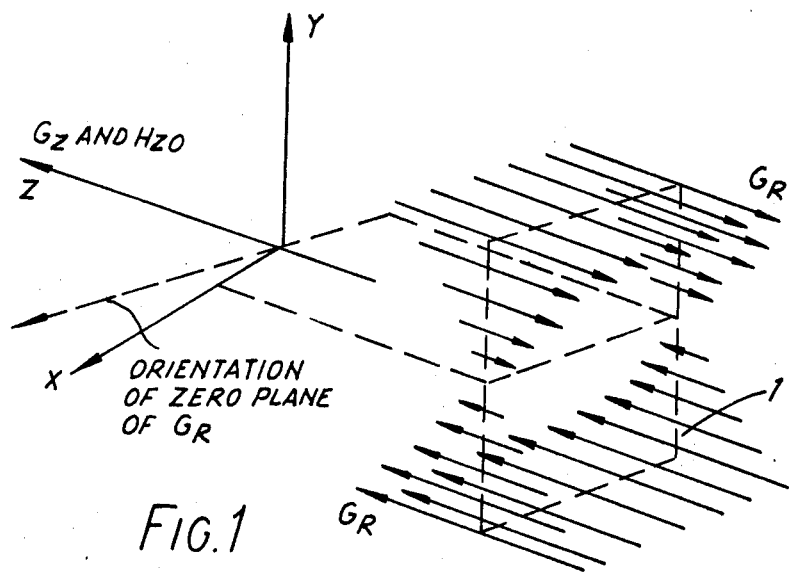

United States Patent [19]

Young

[11] 4,284,948
[45] Aug. 18, 1981

[54] IMAGING SYSTEMS
[75] Inventor: Ian R. Young, Sunbury on Thames, England
[73] Assignee: EMI Limited, Hayes, England
[21] Appl. No.: 40,289
[22] Filed: May 18, 1979
[30] Foreign Application Priority Data
May 25, 1978 [GB] United Kingdom ............... 22293/78
[51] Int. Cl.³ ............................................. G01N 27/00
[52] U.S. Cl. ..................................... 324/309; 324/313
[58] Field of Search ................. 324/300, 307, 309, 313
[56] References Cited
U.S. PATENT DOCUMENTS

| | | | |
|---|---|---|---|
| 3,530,371 | 9/1970 | Nelson et al. ......................... | 324/313 |
| 3,778,614 | 12/1973 | Hounsfield . | |
| 3,924,129 | 12/1975 | LeMay . | |
| 4,115,730 | 9/1978 | Mansfield ............................. | 324/309 |

OTHER PUBLICATIONS

Mansfield Contemp. Phys., 1976, vol. 17, No. 6, pp. 553–576, "Proton Spin Imaging by Nuclear Magnetic Resonance".
Easson—The Microwave Journal, Feb. 1971, pp. 53–54, 56, 58, and 68, "Design and Performance of Yig-tuned Gunn Oscillators".
Zublin et al.—The Microwave Journal, Sep. 1975, pp. 33–35 and 50, "Ka-band YIG-tuned GaAs Oscillator".

Primary Examiner—Michael J. Tokar
Attorney, Agent, or Firm—Fleit & Jacobson

[57] ABSTRACT

In an imaging apparatus using nuclear magnetic resonance, first and second gradient field pulses are applied, the second being of opposite sense to the first. It is preferable to match these so that they entirely cancel. However it is shown to be sufficient if they are as close as possible to the same magnitude and a further 'glitch' pulse is used to reduce the total gradient field over the pulse sequence substantially to zero.

19 Claims, 18 Drawing Figures

IMAGING SYSTEMS

The present invention relates to systems for providing images of distributions of a quantity, in a chosen region of a body, by gyromagnetic resonance, for example nuclear magnetic resonance (NMR) techniques. Such techniques may be used for examining bodies of different kinds. However a particularly beneficial application is the examination of patients for medical purposes.

Nuclear magnetic resonance is known for the analysis of materials, particularly by spectroscopy. Recently it has been suggested that the techniques be applied to medical examination to provide distributions of water content or relaxation time constants in sectional slices or volumes of patients. Such distributions are similar to, although of different significance from, the distributions of x-ray attenuation provided by computerised tomography (CT) systems.

Practical NMR systems operate by applying suitable combinations of magnetic fields to the body being examined, via coil systems, and detecting induced currents in one or more detector coil systems. A suitable sequence of pulsed magnetic fields has been devised to achieve accurate and rapid examination. However, satisfactory operation of the sequence depends on providing fields which precisely conform to desired conditions. One preferred pulse sequence requires the repetition, in an inverted sense, of a first part of the sequence to drive magnetic spins being evaluated back to their initial position. In particular a field gradient pulse $G_R$ is to have its effect reversed by a following $-G_R$ pulse.

It is an object of this invention to provide a pulse sequence for which the effect of the $G_R$ pulse is conveniently reversed.

According to the invention there is provided an NMR apparatus, for examining at least one slice of a body, including means for applying to the body a steady magnetic field along an axis therein, means for applying a gradient field which, in conjunction with said steady field gives a predetermined field in said slice, means for applying a pulsed rotating magnetic field at the Larmor frequency for said slice to cause resonance therein, means for applying a further pulsed magnetic field having a gradient across the slice in one direction and a second further pulsed magnetic field of opposite sense to the first further field and means for sensing the resonance signal resulting from the slice during the said further pulsed fields, the apparatus further including means for applying a pulsed correction magnetic field chosen so that the total algebraic integral over the two further fields and the correction field is less than the total field integral for the two further fields.

According to another aspect of the invention there is provided a nuclear magnetic resonance apparatus, for examining at least one region of a body, the apparatus including means for applying magnetic fields to cause resonance preferentially in said region, means for applying a magnetic field having a gradient in said region to cause phase dispersion in said resonance, means for applying a second magnetic field having a gradient in said region but of opposite sense to the first gradient field to oppose said phase dispersion, means for sensing the resonance signal resulting from the region during said gradient fields for processing to provide nuclear magnetic resonance information for said region, and means for applying a third magnetic field having a gradient in said region the sense direction and magnitude of said third gradient field being such as to further reduce any phase dispersion in said resonance outstanding after the application of the first and second gradient fields.

Figure 2:
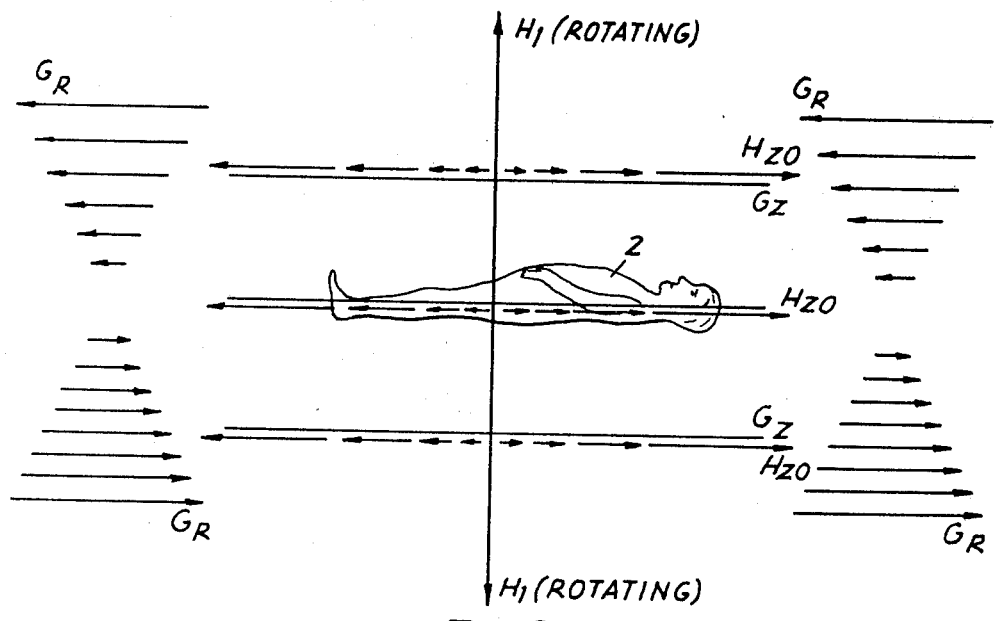
Figure 3A:
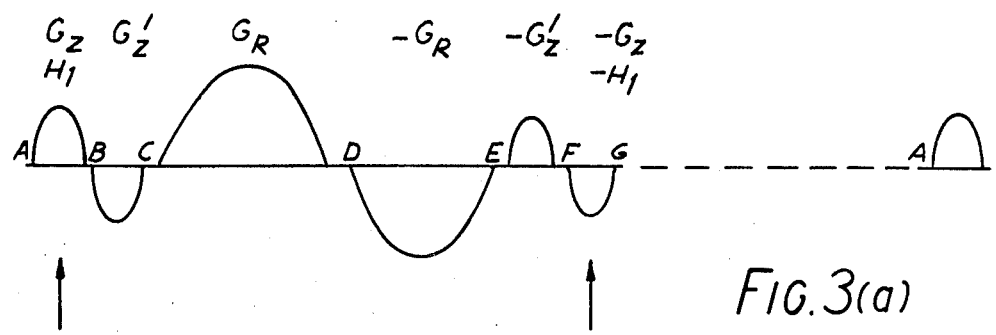
Figure 3B:
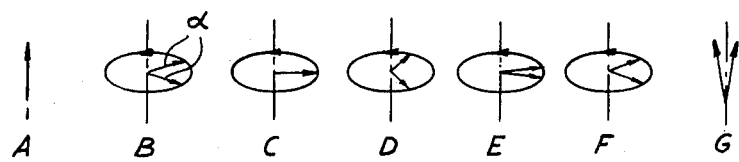
Figure 6:
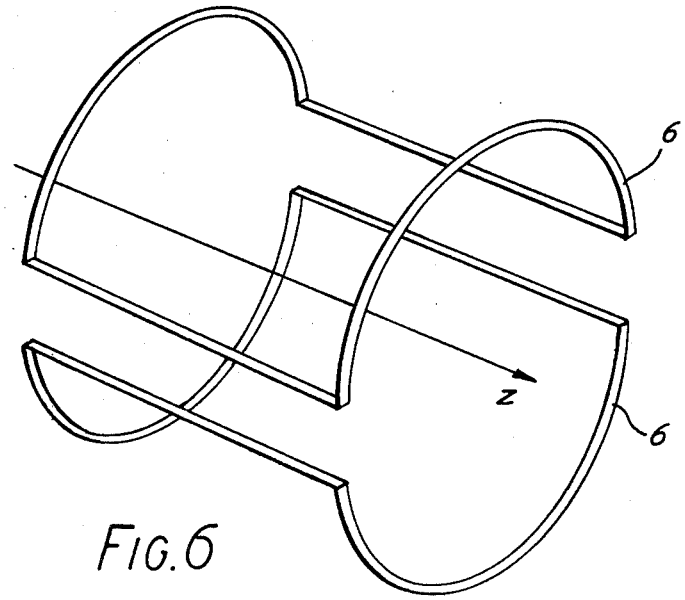
Figure 4:
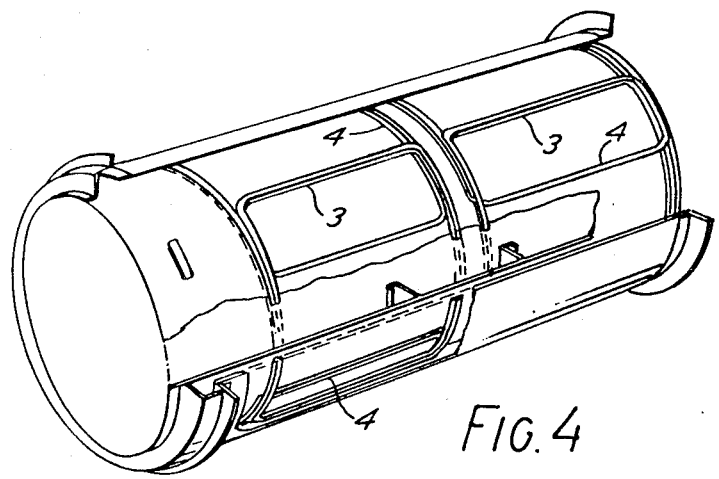
Figure 5A:
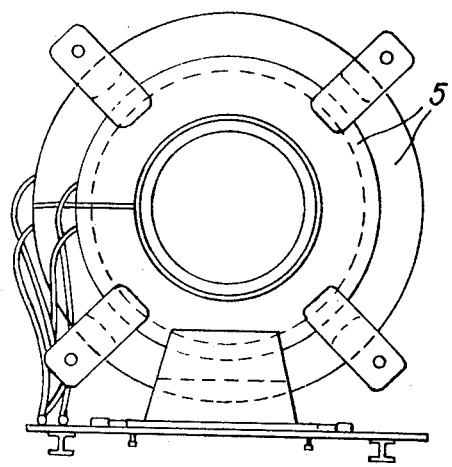
Figure 5B:
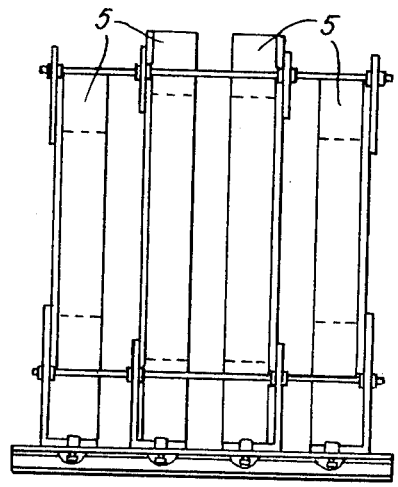
Figure 7:
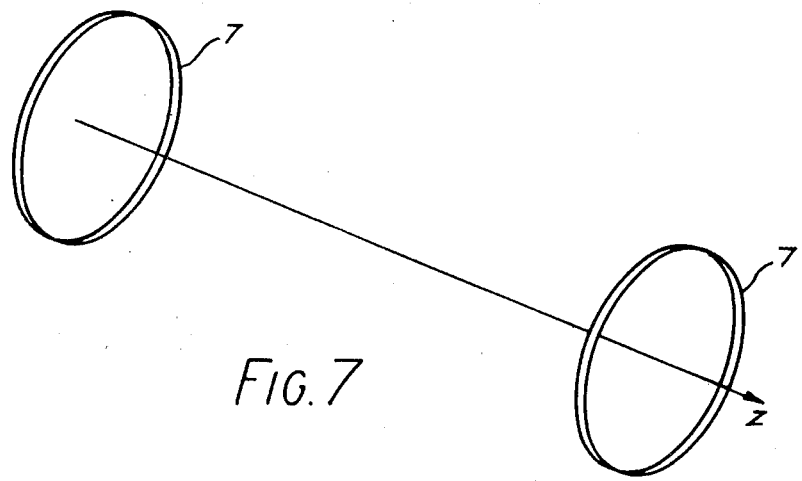
Figure 8:
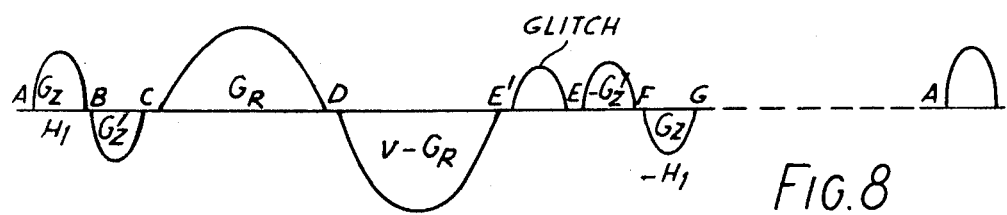
Figure 9:
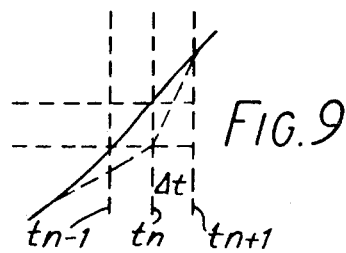
Figure 10:
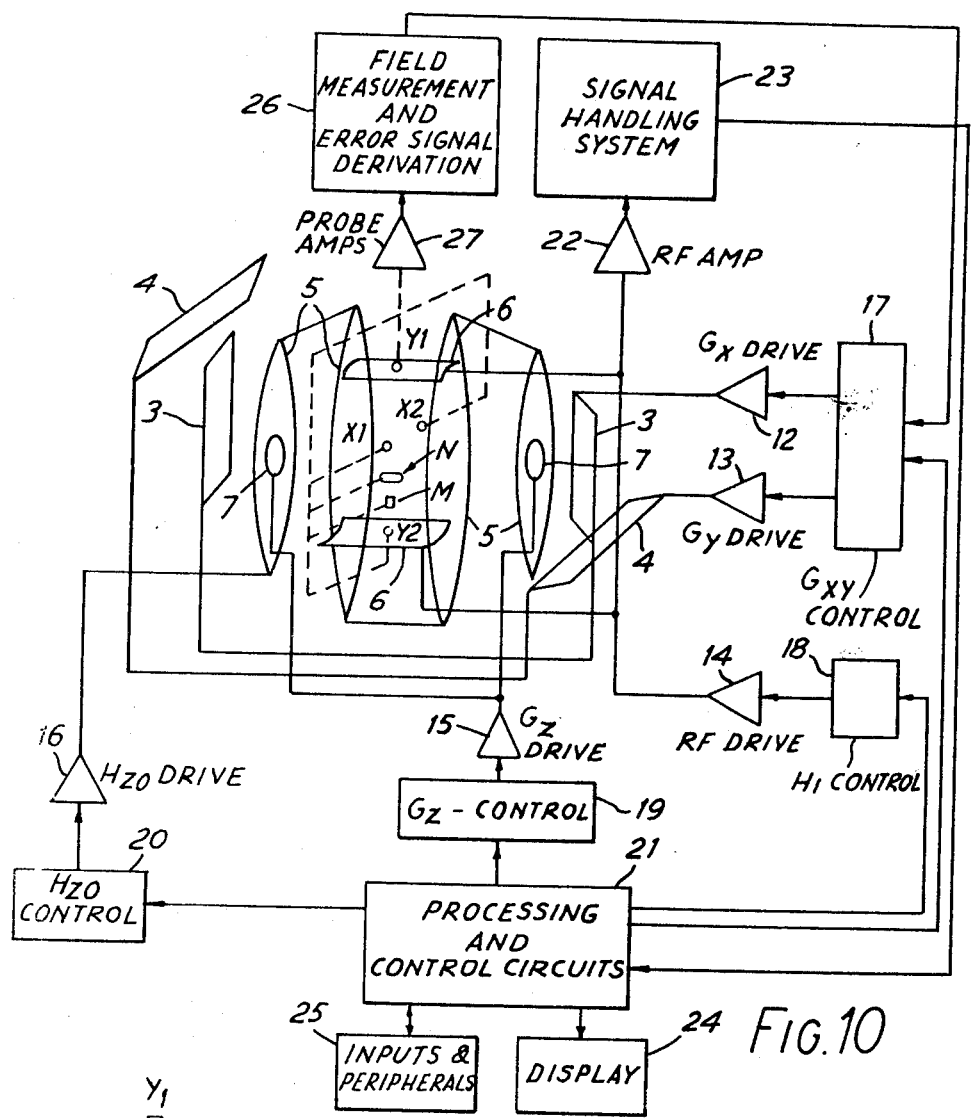
Figure 11:
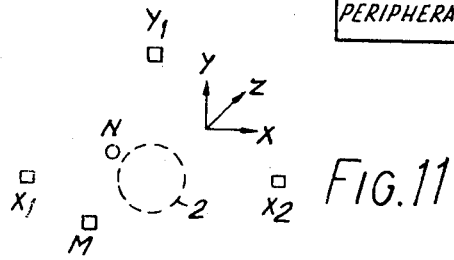
Figure 12:
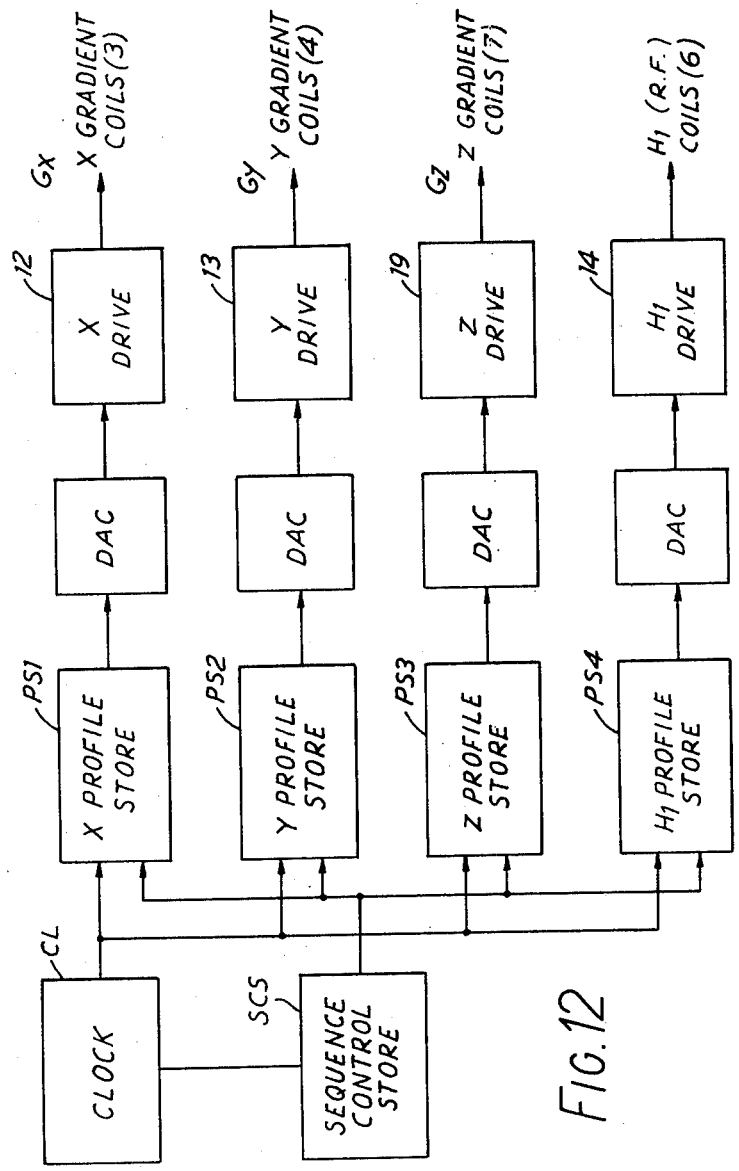
Figure 13:
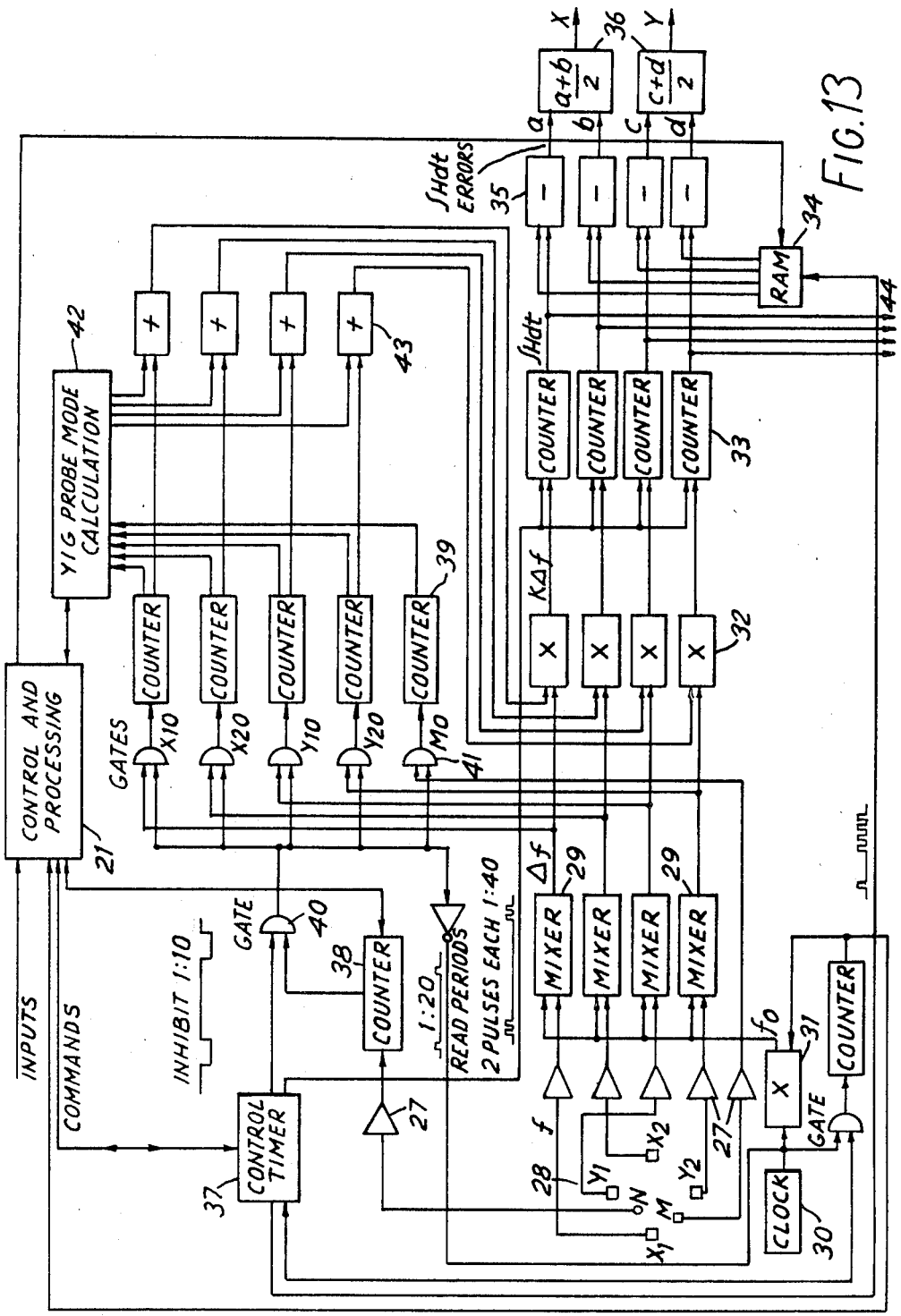
Figure 14:
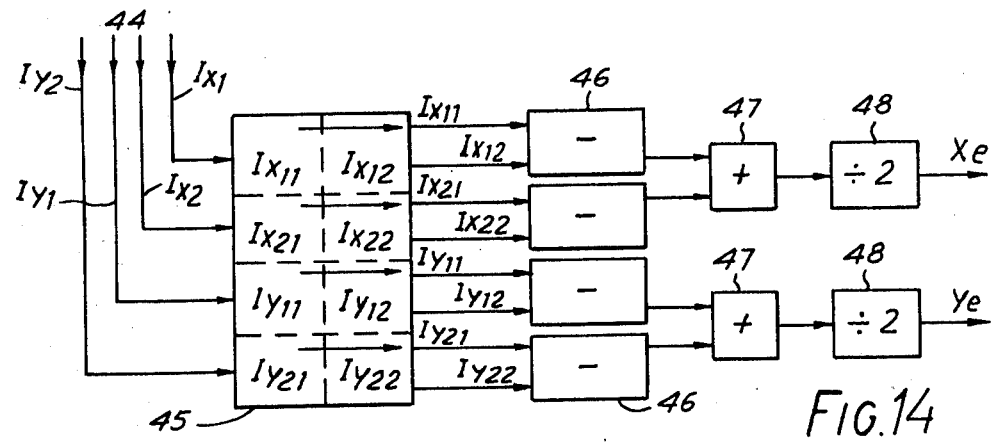
Figure 16:
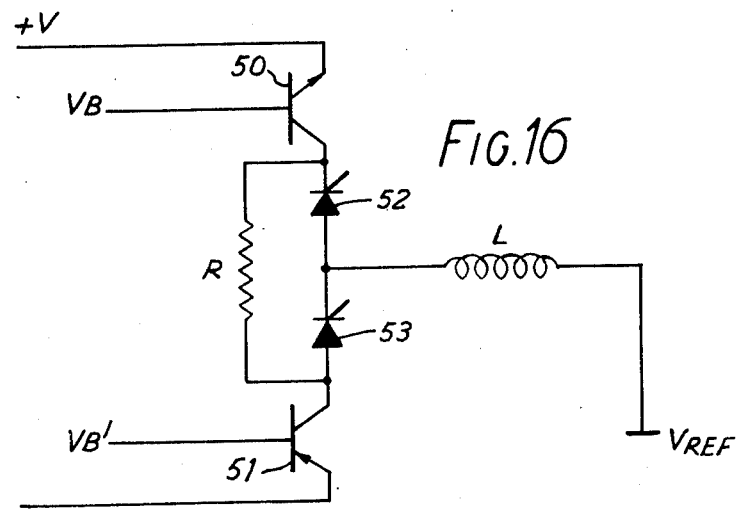
Figure 15:
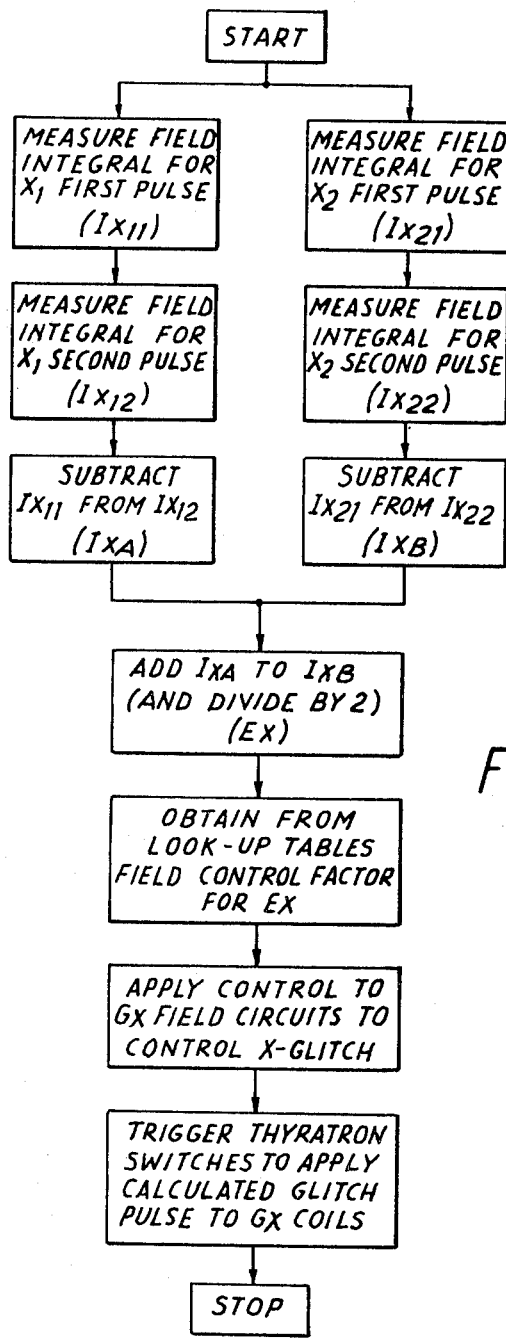

In order that the invention may be clearly understood and readily carried into effect it will now be described by way of example with reference to the accompanying drawings, of which:

FIG. 1 shows the form of the $G_R$ field,
FIG. 2 shows the relationship of the $G_R$ field to the other field,
FIG. 3a shows a useful field pulse sequence,
FIG. 3b shows the effects of the pulses of FIG. 3a on the proton spin vectors,
FIG. 4 shows typical $G_x$ and $G_y$ field culs in a practical NMR machine,
FIGS. 5a and 5b show the $H_{ZO}$ field coil of that machine.
FIG. 6 shows the $H_1$ field coils of that machine,
FIG. 7 shows the $G_Z$ field coils of that machine,
FIG. 8 shows a modified pulse sequence including a correction in accordance with one example of this invention,
FIG. 9 shows in detail the nature of the correction,
FIG. 10 shows a block diagram of the complete NMR apparatus,
FIG. 11 shows the disposition of the field sensing probes used,
FIG. 12 shows typical processing and control circuits for use in the apparatus of FIG. 10,
FIG. 13 shows, in block diagrammatic form, the circuits for $G_R$ pulse correction,
FIG. 14 shows a circuit cooperating with that of FIG. 12 to derive the resultant errors for determining the correction pulse of this invention,
FIG. 15 is a flow diagram of the correction process and
FIG. 16 shows a circuit for injecting the correction into a coil.

For the examination of a sample of biological tissue NMR primarily relates to protons, (hydrogen nuclei) of water molecules in the tissue. In principle however, other nuclei could be analysed, for example, those of deuterium, tritium, fluorine or phosphorus.

Protons each have a nuclear magnetic moment and angular momentum (spin) about the magnetic axis. If then a steady magnetic field $H_{ZO}$ is applied to the sample the protons align themselves with the magnetic field, many being parallel thereto and some being anti-parallel so that the resultant spin vector is parallel to the field axis. Application of an additional field $H_1$ which is an R.F. field of frequency related to $H_{zo}$, in a plane normal to $H_{zo}$, causes resonance at that frequency so that energy is absorbed in the sample. The resultant spin vectors of protons in the sample then rotate from the magnetic field axis (z-axis) towards a plane orthogonal thereto (x,y). The R.F. field is generally applied as a pulse and if $\int H_1 \, dt$ for that pulse is sufficient to rotate the resultant spin vectors through 90° into the x,y plane the pulse is termed a 90° pulse.

On removal of the $H_1$ field the equilibrium alignments re-establish themselves with a time constant $T_1$, the spin-lattice relaxation time. In addition a proportion of the absorbed energy is re-emitted as a signal which can be detected by suitable coils, at a resonant frequency. This resonance signal decays with a time constant $T_2$ and the emitted energy is a measure of the water content of the sample.

As so far described, the resonance signal detected relates to the entire sample. If individual resonance signals can be determined for elemental samples in a slice or volume of a patient then a distribution of proton densities, in effect of water content, can be determined for that slice or volume. Additionally or alternatively it is possible to determine a distribution of $T_1$ or $T_2$.

In general the principles of analysing proton density by NMR in a slice of a body have been extensively discussed. The known techniques have been reviewed by P. Mansfield in Contemp. Phys. 17 (b) 1976, 553–576. Consequently the techniques will only be discussed in detail herein to the extent necessary to understand the improved arrangement of this invention.

In the embodiment discussed herein the examination is particularly of a cross-sectional slice of the patient, although examination of a larger volume is possible, either by examination of a plurality of adjacent slices, or by a specifically volume scan.

The first step is to ensure that resonance occurs at the chosen frequency only in the selected slice. Since the resonance frequency (the Larmor frequency) is related to the value of $H_{zo}$, the slice selection is achieved by imposing a gradient on $H_{zo}$ so that the steady field is of different magnitude in different slices of the patient. The steady and uniform $H_{zo}$ field is applied as before, usually longitudinal to the patient. An additional magnetic field $G_z$ is also applied, being a gradient $G_z = \partial H_z / \partial z$. If then the pulsed $H_1$ field is applied at the appropriate frequency, resonance only occurs in that slice in which the resonance frequency as set by $H_{zo}$ and the local value of $G_z$ is equal to the frequency of $H_1$. If the $H_1$ pulse is a 90° pulse, it brings the spin vectors into the x, y plane only for the resonant slice. Since the value of the field is only significant during the $H_1$ pulse, it is only necessary that $G_z$ be applied when $H_1$ is applied, and in practice $G_z$ is also pulsed. The $H_1$ and $G_z$ fields are therefore then removed. It is still, however, possible to change the resonant frequencies of the spin vectors which are now in the x, y, plane. This is achieved by applying a further field $G_R$, (actually $\partial H_z / \partial R$) which is parallel to $H_{zo}$. The intensity of $G_R$, however, varies from a maximum at one extreme of the slice, through zero in the centre to a maximum in the reverse direction on the opposite surface. The $G_R$ field is illustrated in FIG. 1, the arrows indicating only magnitudes at points on a rectangle 1. There will of course be a smooth variation through and between the magnitudes illustrated. The fields are also illustrated diagrammatically in the side elevation of FIG. 2 in relation to a patient 2. Correspondingly the resonant frequencies will vary smoothly across the slice from one side to the other.

As mentioned before, the signal which now occurs is at the resonant frequency. Consequently the signals received from the slice will also have frequencies which vary across the slice in the same manner. The amplitude at each frequency then represents inter alia the proton density in a corresponding strip parallel to the zero plane of $G_R$. The amplitude for each strip can be obtained by varying the detection frequency through the range which occurs across the slice. Preferably however the total signal at all frequencies is measured. This is then Fourier analysed by well known techniques to give a frequency spectrum. The frequency appropriate to each strip will be known from the field values used and the amplitude for each frequency is given by the spectrum.

As discussed, for the field $G_R$ illustrated in FIG. 1, the individual signals derived from the frequency spectrum, for increments of frequency, correspond to incremental strips parallel to the zero plane of $G_R$. These signals are similar in nature to the edge values derived and analysed for x-ray beams in computerised tomography. The X-ray edge values are obtained for sets at a plurality of different orientations in an examined slice and then are processed by a suitable method, such as that described in U.S. Pat. No. 3,778,614 and the further development thereof described in U.S. Pat. No. 3,924,129.

It will be apparent that by changing the orientation, about the Z-axis, of the zero plane of $G_R$, further sets of signals can be obtained representing proton densities along lines of further sets of parallel lines at corresponding further variations in the examined slice. The procedure is therefore repeated until sufficient sets of "edge values" have been derived to process by methods like those used for sets of x-ray beams. In practice the $G_R$ field is provided by combination of two fields $G_x$ and $G_y$, which are both parallel to $H_z$ but have gradients in orthogonal directions. The direction of the gradient of the resultant $G_R$ is therefore set by the relative magnitudes of $G_x$ and $G_y$. At many points in the following description reference will be made to the creation of $G_R$ field pulses and it should be remembered even where $G_x$ and $G_y$ fields are not individually discussed that reference is to the resultant of $G_x$ and $G_y$ field pulses.

The full examination for one direction of the $G_R$ gradient is achieved by applying, via appropriate coils, the sequence of field pulses shown in FIG. 3a. FIG. 3b shows the effect which each pulse has on the spin vector. It will be appreciated that the $H_1$ field is a rotating field about the z-axis. Correspondingly the spin vectors thereafter precess about the z-axis. For clarity of explanation the spin vectors are shown in FIG. 3b on a coordinate system which rotates with $H_1$.

Referring to FIGS. 3a and 3b together, the pulse cycle comprises six phases, AB to FG, and a recovery period shown by the broken line. The $H_{zo}$ field is continuously present throughout the cycle.

Prior to the first pulse, or after the recovery period if an earlier cycle has been implemented, the mean spin moments are substantially aligned with the z-axis as shown at A in FIG. 3(b).

The gradient field $G_z$ pulse and $H_1$ pulses (AB), simultaneously applied, respectively select the slice and bring the resultant spin moments into the x, y plane (still, of course, precessing about the z-axis). Although the resonant frequency is the same throughout the slice selected, there is a phase dispersion introduced because the excitation occurred in a field gradient. Thus the spin moments are as shown at $\alpha$ in part B of FIG. 3(b) though dispersed between limits much greater than can be satisfactorily illustrated. The limits shown at $\alpha$ are merely indicative of the nature of the dispersion. It has been found that this phase dispersion can be reversed by the application of a negative field gradient pulse, that is a pulse of the correct relative magnitude as $G_z$ but 180° displaced (the magnitude relation being about 55%). This pulse BC is therefore applied to bring the spin moments in the x, y plane into phase as shown in part C of FIG. 3(b). The $H_1$ field need not be continued into the negative gradient pulse ($G_z'$) but it can be continued during that pulse if required to ensure that the spin moments go into the x, y plane.

At that time a signal could be sensed to give proton density for the whole slice. However in this sequence, the signal is sensed in the presence of a $G_R$ pulse CD which gives frequency dispersion in a selected direction (r) in the slice as previously described. The change to the new frequencies is almost instantaneous with the application of the $G_R$ pulse and is maintained proportionately throughout the pulse. As discussed, the signal is sensed and frequency analysed to give the proton densities for a plurality of adjacent parallel strips of the slice. After the $G_R$ pulse, the spin moments, which are still largely in the x, y plane despite some relaxation, have a considerable phase dispersion as shown in part D of FIG. 3(b) (which is illustrative—as the actual dispersion is $n\pi$ (n being 100 or more)). At that stage, if a further cycle as described so far were to be required, it would be necessary to wait for spin-lattice relaxation to realign the spin movements with the z-axis. This could take as much as 5 seconds which, since several hundred, or even several thousand cycles (i.e. several cycles for each of a hundred or more orientations of the zero plane of $G_R$) are required, is much too long.

It is proposed to return the spin moments substantially back to the starting position (part A of FIG. 3(b)) by repeating the pulse sequence up to D in the reverse order and reverse sense. Since the $-G_R$ pulse is substantially the same as the $G_R$ pulse except for its sense, further signals may be detected during it. These relate to the same r direction as for the forward pulse and help to improve the signal to noise ratio.

After the reverse pulse sequence, the spin moments still show some deviation from the z axis due to phase dispersions caused by spin-spin coupling. This can not be reversed by this pulse sequence nor, it is believed, by any other. The period GA therefore allows some relaxation to thermal equilibrium (time constant $T_1$) which eliminates the effect of the phase dispersion and also reduces the effects of any mismatching between the forward and reverse pulses. Although the relaxation period GA is still necessary, the use of the reversed pulse sequence D to G much reduces that period and allows faster repetition of the total sequence for other r-directions. The length of the signal measurement period CE is influenced by the phase dispersion caused by $H_{zO}$ field inhomogeneity and also by the dispersion caused by spin-spin coupling. If the effect of $H_{zo}$ field inhomogeneity is considered to excessively shorten the period CE then pulse FG may be a 180° r.f. pulse rather than a 90° pulse. Turning the spin moments through 180° produces a so-called "spin-echo" of known form and the $G_R$ pulses similar to CD and DE can be repeated to give a further signal measurement period. The spin-echo procedure is known to reverse the dispersion due to field inhomogeneity and can be repeated here several times until sufficient signal has been obtained or until spin-spin dispersion, which cannot be reversed, becomes excessive. As in the sequence of FIG. 3(a), a spin-echo sequence should end with pulses EF, FG and recovery period GA.

The ratio of period GA to period AG should preferably be approximately the ratio of $T_1$ to $T_2$ for maximum sensitivity. Typically the total period AGA is 40 m sec where AG is approximately 5.5 m sec, AB is 300 $\mu$sec and CD is 2 m sec. The $H_1$ pulse is typically of 0.6 Oe and has a frequency of 4.26 $MH_Z$ for an $H_{zo}$ of 1000 $O_e$. All other pulses are at envelope frequencies, $G_z$ being typically +30 Oe to −30 oe, $G_R$ being 15 Oe to −15 Oe.

In the preferred embodiment $G_{z'}$ is less than $G_z$; typically $$\int G_{z'} dt = 0.55 \int G_z dt \text{ to } 0.60 \int G_z dt$$

As mentioned hereinbefore, the $G_R$ field pulses are the resultant of $G_x$ and $G_y$ components. The $G_x$ components are provided by four coils 3 and $G_y$ components by four coils 4, the coils 3 and 4 each comprising two pairs of saddle coils mounted on a common former as shown in FIG. 4; each pair being spaced from the other in the z-direction.

FIGS. 5a and 5b show in end and side elevation respectively a practical coil arrangement to provide the $H_{zo}$ field. The steady $H_{zo}$ field is provided by four coils 5 connected in series, although a smaller number could be used. Further details of the coil windings will not be given since suitable coils can readily be devised, by those with the appropriate skills, to provide the fields required.

FIGS. 4, 5a and 5b do not show the $H_1$ and $G_Z$ coils so as to reduce the complexity of the drawings.

The $H_1$ coils are shown in FIG. 6 in perspective. They comprise two saddle shaped coils 6 which are driven in parallel to provide the rotating $H_1$ field and which are, in this example, also used to detect the signals which are of approximately the same frequency. It can be advantageous to use separate receiving coils, however, for signal detection.

FIG. 7 shows, also in perspective, two circular coils 7 which provide the $G_z$ field component for the gradient superimposed on $H_{zo}$.

Also included in the coil system are a set of field measurement probes whose purpose will be discussed further hereinafter. Four of these may be yttrium iron garnet tuned oscillators (so called "YIG oscillators") and there is also at least one simple NMR probe.

The NMR apparatus described so far can be constructed by those with experience in this art to provide the required data for a slice of a patient's body. For sufficiently accurate results to give diagnostically useful information it is, however, desirable, and in some cases important, that some factors, in particular the magnetic fields, are precisely controlled. For example it is desirable that the $H_{zo}$ field should be uniform to around 2 parts in $10^6$ over the examined slice. This uniformity can be affected by the quality of the coils used and by adjacent ferromagnetic materials, which should therefore be kept to a minimum.

Also requiring great precision are the $G_R$ gradient fields which, as discussed before, are constructed from $G_x (=G_R \sin \phi)$ and $G_y (=G_R \cos \phi)$ pulses. The $G_R$ gradient vector should be in the desired direction with the least error possible. Furthermore the $-G_R$ pulse should reproduce, in the opposite sense, the preceding $G_R$ pulse. Arrangements for the production of the required precision of the $G_R$ pulse are the subject of a U.S. patent application Ser. No. 039649. It is there proposed to provide a continuously operative control system, responsive to field sensitive probes disposed within the coil system, to respond to changes in the measured field, relative to the field precalculated as desirable, and to make appropriate corrections.

Corrections can be made to the pulses to satisfy one of two criteria. In one arrangement one of the $G_x$ or $G_y$ pulses can be matched to the other, (in all respects apart from the relative magnitudes to be imposed on them to direct $G_R$ appropriately). Preferably that pulse for which ∫Hdt is greater is matched to that for which it is lower. In the second arrangement, both pulses can be matched to a predetermined standard. These arrangements, properly implemented, ensure the correct direction of the $G_R$ vector.

If the second arrangement is adopted for both the $G_R$ and the $-G_R$ pulse it will be apparent that, in matching the same standard, they will tend to match each other. There will nevertheless tend to be differences. For the first arrangement, in which $G_x$ and $G_y$ for $G_R$ are matched independently of $-G_x$ and $-G_y$ for $-G_R$, there is no certainty that $G_R$ and $-G_R$ will be matched. The consequence of their not being matched is that the recovery period GA will need to be longer. To reduce the recovery period and allow faster examination, which is important for medical use, it is proposed particularly for the aforementioned first error correction scheme, that the total ∫Hdt for the $G_R$ pulses should be zero.

It may not always be convenient to match $-G_R$ with $G_R$ and it is therefore the principle of this invention to provide further pulses on the $G_x$ and $G_y$ coils such that in one pulse sequence the total ∫Hdt for those coils is substantially zero. Preferably the numerical value of ∫Hdt for the $-G_R$ pulses is made greater than that for the $G_R$ pulses and further positive pulses are provided to reduce the difference remaining.

FIG. 2 which, like FIG. 3a, is not to correct relative scale for the different pulses, shows the pulse sequence modified to include the extra pulse between E' and E. This pulse, which will be called a "glitch" pulse, has a vector in the same direction as $G_R$ (if the condition of the previous paragraph is met). In practice, since $G_R$ is formed by $G_x$ and $G_y$, it is more convenient to provide individual $G_x$ and $G_y$ "glitch" pulses. Thus ∫$H_x$dt and ∫$H_y$dt are separately brought to zero. It should be emphasised that, unlike $G_R$ and $-G_R$, this pulse is not used for obtaining readings but merely to hasten recovery of the system. It will be understood that more than one glitch pulse on each of the $G_x$ and $G_y$ coils could be used but that a single pulse is preferable.

For correction of the $G_R$ vector, the field measurements to be obtained by sampling at the chosen times are precalculated. In practice it is convenient to choose sample times such that the field samples are spaced at equal increments of ∫Hdt. The times at which these samples are expected are therefore stored in the controlling circuits.

If samples are taken at these predetermined times then the difference between the calibrated field ($\phi$ calibrated) and the field actually sampled ($\phi$ real) is an error signal E. Alternatively it can be convenient to sample when the predetermined fields are reached and record the time of the sampling. In that case the basic error signal is the difference between the time at which a particular sample was expected and the time at which it was actually measured by the field probe system. It is then possible to accumulate these errors over the entire $G_R$ and $-G_R$ pulses. To some extent the errors tend to cancel. However, residual errors at the end of the two pulses indicate the extent to which they were not matched and these residual errors are used to construct the correcting "glitch" pulse.

The $G_R$ pulses themselves may take different forms as preferred by those setting up the equipment. In one preferred form they would be square gradient pulses, although this is not possible in practice for engineering reasons. However the invention may be implemented with any desired pulse shape, which can be provided in practice, by calculating fields at chosen times. One suitable pulse is a half sine wave.

In a practical implementation, because of corrections and adjustments which do not form part of this invention, the real gradient pulses are distorted half sine waves. This distorted form can satisfactorily be used provided the pulses are matched to each other or both matched to the chosen shape. For the purposes of this description, however, it will be assumed that matching is to be to the ideal half sine wave.

Ideally it is desired to correct the field errors as they appear and thus to prevent their accumulation. Thus $\phi$ real is to be brought back to $\phi$ calibrated during the interval $\Delta t$ between $t_n$, at which the sample was taken and $t_{n+1}$, which is the next sample time. The error E has units of ampere seconds and the correction is by injection of a current $I_C$ into the field coils during the time $\Delta t = t_{n+1} - t_n$. The desired effect is shown in FIG. 9, the vertical axis of which represents ∫H·dt.

FIG. 10 shows, in simplified form, an NMR apparatus, suitable for medical examination, employing the pulse sequence explained with reference to FIG. 3a and including field control for determination of the $G_R$ pulses.

The coils 3, 4, 5, 6 and 7, which are shown in highly schematic form, represent those shown hereinbefore, and identified by the same reference numbers, in FIGS. 4 to 6. They are driven by $G_x/G_y$, $R_F(H_1)$, $G_Z$ and $H_{ZO}$ control circuits 17, 18, 19 and 20 respectively. These circuits can take suitable forms which will be known to those with experience of NMR equipment and other apparatus using coil induced magnetic fields. The circuits are controlled by circuits 21 to achieve the pulse sequence described or another appropriate one.

The signal to be sensed during the $G_R$ pulses is detected in the $H_1$ coils 6 and is amplified by a RF amplifier 22 before being applied to signal handling circuits 23. Circuits 23 are arranged to make any appropriate calibrations and corrections but essentially transmit the signals, which are effectively proton density values for lines in the body, to processing circuits to provide the required representation. These circuits can be specially designed to implement the CT type processing as described and claimed in U.S. Pat. No. 3,924,129. However it is advantageous to implement the processing by a suitably programmed digital computer. This computer can also conveniently control the pulse sequence and thus may also constitute the circuits indicated at 21. The picture thus obtained is viewed on a display 24, such as a television monitor, and this may include inputs and other peripherals 25 for the provision of commands and instructions to the machone or other forms of output.

Thus far described, the machine is essentially a variation of known types of NMR apparatus, arranged to implement the new pulse sequence described hereinbefore.

Further to this however, and to implement the invention, it includes field measurement and error signal circuits 26 which receive signals via amplifiers 27 from the field probes $X_1$, $X_2$, $Y_1$, $Y_2$, N and M shown. The positions of the probes, in relation to the examined slice of body 2, are further shown in FIG. 11. $X_1$, $X_2$, $Y_1$ and $Y_2$ are the YIG (yttrium-oxide-garnet) tuned oscillator probes referred to hereinbefore. These are standard magnetic field measuring probes such as described by R. M. Easson (The Microwave Journal, February 1971 pp 53-58 and 68) or by Zublin et al (The Microwave Journal), September 1975 pp 33–35 and 50). These probes provide measures of the fields at the points at which they are situated as oscillations of field proportional to frequency (2.8 MH$_Z$/Oe). The values measured are therefore obtained by a count of the oscillations in a set time. In practice the YIG probes can oscillate in different modes and it is necessary to determine the mode in operation. For this purpose there are provided NMR probes M and N. Both of these probes are simply miniature cells of pure water (such as a closed test tube) surrounded by a small coil. They give a reliable resonance of 4.26 kH$_z$/Oe and can be used to check the YIG tuned oscillator modes. Probe N, fixed in space, acts as a reference, a moveable NMR probe M may be moved adjacent to the YIG modes in turn to provide data for determining their modes of oscillations, their orientation, and other performance observations. Once their calibrations are achieved, these probes in conjunction with NMR probe N can be used to generate the required signals for G$_R$ field control purposes.

FIG. 12 shows, in schematic view, components which may typically form part of the processing and control circuits of FIG. 10. Four profile stores PS1-4 store the required pulse shapes in terms of a sequence of current amplitudes and the required duration (number of clock pulses) at each amplitude. The specified current at any instant is then supplied by the corresponding drive circuit (12, 13, 19 or 14) to the corresponding coil (3, 4, 7 or 6). The operation of the four profile stores is controlled by a sequence control store SCS which stores the sequence of activation of the profile stores and the duration (number of clock pulses) of operation of each stage of the sequence (including gaps in the pulse sequence). A clock CL controls the overall timing operation of the circuits.

There is shown in FIG. 13 a block diagram of the G$_R$ field correction circuits. This diagram also includes certain features which are optional but not essential.

The probe system is shown at 28, essentially as in FIG. 10 and 11. Each probe supplies its output to a respective probe amplifier 27. The YIG probe signals at frequency f (2.8 GH$_z$ for a 1kO$_e$ field) are mixed in mixers 29 to bring them to suitable frequencies for counting. Conveniently f$_o$ is chosen so that $\Delta f = f - f_o$ is in the range 150-200 MH$_z$. The signal at f is provided from the system clock 30 (a crystal reference clock) via a multiplier 31.

The signals at frequency $\Delta f$ on each channel are multiplied by a factor k in multipliers 32. The factor k may include many different corrections as desired. However for the moment the most significant error is that the YIG probes can oscillate in different modes. The factor k is determined to correct for the respective oscillation mode and to produce a signal of frequency which properly represents the field measured. The frequency $\Delta f$ is counted in counters 33, over a suitable period, to yield $\int$Hdt.

As discussed hereinbefore, the field errors for the G$_x$ and G$_y$ pulses are given by the differences between precalculated and measured field values at the sample times. The precalculated values are held in a RAM (random access memory) 34. This store may be preloaded by any suitable means. In practice, however, the central computer, comprising processing and control 21, is programmed to calculate the required values and they are loaded into RAM 34 from 21. The field errors are then provided by taking the differences in subtractors 35. These differences are calculated for each probe and averaged in units 35 to give X and Y error signals. As discussed hereinbefore, the field correction is by injection into the G$_R$ field coils of currents proportional to X and Y.

Counting in counters 33 is effected for periods set by the timing control unit 37. This unit takes the output of the system clock 30 and forms control pulses as instructed by the system control 21. A required counting period for the YIG probes can be determined from their characteristics as established. Typically the counting signals are two pulses each 1:40 ratio and closely spaced.

Correction for the different modes of the YIG probes is by use of the NMR probe N with the moving probe M. In an initial procedure before examination begins, counter 36 counts the NMR probe N output with only the H$_{zo}$ field present. As shown this period is set by control 21 but it could be set by timer 37. One YIG probe is calibrated at a time by moving M adjacent to it, so that it experiences as much as possible the same field. Then one probe at a time in the same period the counts of the other probes are taken in counters/staticisers 39. These are set to the same counting period as counter 38 via gates 40 and 41 which set a window of the NMR probe count. The counts from 39 and 38, the latter via unit 21, are passed to a correction unit 42. This unit determines corrections to be added at 43 to the counts in 39 to give factor k which corrects the YIG probe count to the NMR count. The factor k is a simple correction so that k$\Delta$f is the count the NMR probe would have given for the same field.

The system as described so far is sufficient to control the G$_R$ vector (though during a G$_R$ pulse M is not involved). Preferably the H$_{zo}$ field is maintained sufficiently uniform.

As mentioned hereinbefore, the movable NMR probe M is included as part of the setting up procedure with the H$_{zo}$ field only, as the operator must place the movable probe successively at the positions of the YIG probe. Thus there is provided not only the count at N, which is as central as possible to the field, but a local NMR count for each YIG count. The local NMR count M$_o$ shows primarily the YIG tuned oscillator characteristics relative to the local field.

FIG. 13 as described so far is illustrative of circuits for the field correction essentially as described and claimed in the said United States Patent application Ser. No. 039649. It has been mentioned that the "glitch" pulse of this invention can be derived from knowledge of the field errors from the YIG probes. For that reason the circuit of FIG. 12 also provides for the $\int$Hdt counts from counters 33 to be available at 44 for further processing.

A suitable circuit for accumulating the required error signals is shown in FIG. 14. The inputs at 44 from the FIG. 12 circuit are shown as I$_{X1}$ etc. Where I$_{X1}$ is $\int$H$_{dt}$ as measured by YIG probe X$_1$ with corrections as described.

The signals are applied to a store 45, which can conveniently be part of the controlling digital computer. The store 45 holds in different locations the sums of $\int$Hdt over each of the G$_R$ and $-$G$_R$ pulses where I$_{X11}$ is the sum over the first pulse (G$_R$) and I$_{X12}$ is the sum over the second pulse ($-$G$_R$) for probe X$_1$ etc.

It is desired to obtain for each of the X circuits and the Y circuits the total outstanding errors (X$_e$, Y$_e$) after the two G$_R$ pulses. This is achieved by substracting for each YIG probe the sum over the first pulse from the sum over the second pulse, which is arranged to be the greater, in subtractors 46. The total for two X probes and those for the two Y probes are then averaged by their respective address 47 and dividers 48 to give $X_e$ and $Y_e$. Of course, use of these errors involves the introduction of various constants to suit the actual NMR apparatus. These are provided by appropriate calibration and can be arranged to include the division by two if desired.

Having measured the excess $\int H dt$ after the two $G_R$ pulses, in the form of $X_e$ and $Y_e$ error signals, it is necessary to apply the X and Y "glitch" pulses to cancel that excess field. The correction is by injecting appropriate currents into the $G_X$ and $G_Y$ coils substantially as for the $G_R$ corrections.

The necessary current to be injected can be predetermined, either by calculation or by calibration measurements. The information, which is in any case the same as is required for the $G_R$ pulse correction, is stored in look-up tables.

FIG. 15 shows a flow diagram for production of the x-glitch pulse, that for the y-glitch pulse being identical apart from consequential amendments. The diagram is self explanatory and represents steps which, as has been described hereinbefore, can be implemented by specially wired circuits, by suitable programming of a digital computer cooperating with the coils and measurement circuits, or by a combination of both.

It should be noted that the steps of subtracting the two measurements and adding $I_{XA}$ to $I_{XB}$ are not strictly correct. Strictly the average should be given by $(a^2+b^2)^{\frac{1}{2}}$ where $a = (I_{X11} + I_{X12} - 2I_{X10})$ $x = (I_{X21} + I_{X22} - 2I_{X20})$ $I_{X10}$ and $I_{X20}$ being measurements on the respective probes with only $H_{z0}$ present. However in practice the steps given in FIG. 15 are satisfactory where errors are small.

FIG. 16 shows one form of circuit for deriving the glitch pulse in the coil L for X or Y. In this case, a potential is applied to the coil so that the current therethrough rises and is switched off after a time t so that the current in the coil decays. Look-up tables then store for each $X_e$ or $Y_e$ error the time for which the potential should be applied to create the required pulse.

In FIG. 16, transistors 50 and 51 have their base potentials $V_B$ and $V_B'$ and potentials $+V$ and $-V$ chosen so that they pass a current of about 200 mA through resistor R with thyristors 52 and 53 switched off. Although there is a potential difference across the thyristors, that centre point is at $V_{REF}$, which may be 0V. One or other thyristor is then switched on. The choice depends on the direction of the field required, and for $G_X$ and $G_Y$ together this depends on the direction of the $G_R$ vector which is the same as for the glitch pulse. Depending on this choice the respective transistor is switched hard on and the current in the coil builds up linearly. The thyristor then conducts regardless of the current through the coil. The current is stopped at the predetermined time t by switching off the transistors.

It will be understood that many circuits may be derived to give a suitable field pulse when the magnitude of the error to be corrected has been determined.

What I claim is:

1. A nuclear magnetic resonance apparatus, for examining at least one slice of a body, the apparatus including means for applying to the body a steady magnetic field along an axis therein, means for applying a gradient field which, in conjunction with said steady field gives a predetermined field in said slice, means for applying a pulsed periodic magnetic field at the Larmor frequency for said slice to cause resonance therein, means for applying a further pulsed magnetic field having a gradient across the slice in one direction and a second further pulsed magnetic field having a gradient in the same direction but of opposite sense to the first further field and means for sensing the resonance signal resulting from the slice during the said further pulsed fields, the apparatus further including means for applying a pulsed correction magnetic field also having a gradient in said direction and chosen so that the total algebraic integral with respect to time over the two further fields and the corrections field is less than the total field integral for the two further fields.

2. An apparatus according to claim 1 in which the pulsed correction magnetic field is chosen so that the total field integral over the two further fields and the correction field is substantially zero.

3. An apparatus according to either of claims 1 or 2 including a coil system which is energised to provide the further pulsed fields and in which the same coil system is energised to provide the correction magnetic field.

4. An apparatus according to claim 1 including means for sensing the magnetic field during said further pulsed fields and means for summing the magnetic field integral for both of said further pulsed fields to derive a field integral signal indicative of said integral.

5. An apparatus according to claim 4 including means for utilising said field integral signal to control said pulsed correction field.

6. An apparatus according to claim 5 in which the means for sensing the magnetic field include YIG tuned oscillators.

7. An apparatus according to claim 5 or claim 6 in which the means for sensing includes at least one simple NMR probe.

8. An apparatus according to claim 1 in which the means for applying the further fields is arranged so that the total algebraic field integral for the second further field is greater than that for the first further field so that the algebraic field integral for the correction field is required to be positive.

9. A method of examining a body by gyromagnetic resonance the method including the steps of: applying a gradient field which, in conjunction with said steady field gives a predetermined field in said slice, applying a periodic magnetic field at the Larmor frequency for the slice to cause resonance therein; applying a further magnetic field having a gradient across the slice in one direction and a second further magnetic field having a gradient across the slice in the same direction but of opposite sense to the first further field; and sensing the resonance signal resulting from the slice during the further fields wherein the method further includes the step of applying a correction magnetic field also having a gradient across the slice in said direction and being such that the total algebraic field integral with respect to time over the two further fields and the correction field is less than the total field integral for the two further fields.

10. A method according to claim 9 wherein the total field integral for the correction field is substantially equal to and of opposite sign to the total for the two further fields.

11. A method according to either of claim 10 wherein the second further field has a larger total field integral than the first further field so that the total field integral for the correction field is positive.

12. A method according to claim 10 wherein the total field integral for the further fields is measured and used to control the correction field.

13. A nuclear magnetic resonance apparatus for examining at least one cross-sectional region of a body, the apparatus including means for applying to the body a steady magnetic field along an axis therein, means for applying a second magnetic field having a gradient which, in conjunction with said steady field, gives a predetermined field in said region, means for applying a periodic magnetic field at the Larmor frequency for said region to cause resonance therein, means for applying a first further magnetic field having a gradient across the slice in a chosen direction, means for applying a second further magnetic field also having a gradient across the slice and substantially opposing the first further magnetic field, means for sensing the resonance signal resulting from the region during the said further magnetic fields and means for applying a third further magnetic field having a gradient in the region, being substantially equal and opposite to any difference between the first and second further fields to reduce the total magnetic field integral over the three further magnetic fields to substantially zero.

14. A nuclear magnetic resonance apparatus, for examining at least one region of a body, the apparatus including means for applying magnetic fields to cause resonance preferentially in said region, means for applying a magnetic field having a gradient in said region to cause phase dispersion in said resonance, means for applying a second magnetic field having a gradient in said region but of opposite sense to the first gradient field to oppose said phase dispersion, means for sensing the resonance signal resulting from the region during said gradient fields for processing to provide nuclear magnetic resonance information for said region, and means for applying a third magnetic field having a gradient in said region the sense direction and magnitude of said third gradient field being such as to further reduce any phase dispersion in said resonance outstanding after the application of the first and second gradient fields.

15. A nuclear magnetic resonance apparatus, for examining a region of a body, the apparatus including means for applying magnetic fields to cause resonance preferentially in said region, means for applying component magnetic fields, one of which may be of zero magnitude, having gradients in orthogonal directions in said region to provide a first magnetic field having a gradient in a chosen direction to produce phase dispersions in said resonance insaid direction, means for applying further component magnetic fields, one of which may be of zero magnitude, having gradients in orthogonal directions in said region to provide a second magnetic field having a gradient in said region in a direction and of a magnitude to oppose the first gradient field to tend to reduce said phase dispersion, means for sensing the resonance signal resulting from the region during said gradient fields for processing to provide nuclear magnetic resonance information for said region, and means for applying yet further component magnetic fields one of which may be of zero magnitude, having gradients in orthogonal directions in said region to provide a third magnetic field having a gradient in said region, of a magnitude and direction to tend to reduce phase dispersion in said resonance outstanding after the application of the first and second gradient fields.

16. A method of examining a body by nuclear magnetic resonance, the method including: applying magnetic fields to cause resonance preferentially in a region of the body; applying a magnetic field having a gradient in the region to cause phase dispersion in the resonance; applying a second magnetic field having a gradient in the region but opposing the first gradient field to tend to reduce said resonance; sensing the resonance signal resulting from the region during the gradient fields for processing to provide nuclear magnetic resonance information for said region; and applying a third magnetic field having a gradient in the region, the third magnetic field being arranged to tend to reduce phase dispersion in the resonance outstanding after the application of the first and second magnetic fields.

17. A nuclear magnetic resonance apparatus, for examining a region of a body, the apparatus including means for applying magnetic fields to cause resonance preferentially in said region, means for applying a first magnetic field having a gradient across the region in a chosen direction and a second magnetic field having a gradient across the region in substantially the same direction but of opposite sense to the first gradient field, means for sensing the resonance signal resulting from the region during the said gradient fields and means for applying a correction magnetic field also having a gradient across the region in substantially the same direction and chosen so that the total algebraic integral with respect to time of the magnetic field intensity over the three gradient fields is less than the total field integral for the first and second gradient fields.

18. An apparatus according to claim 17 in which the correction gradient field is chosen so that the total field integral over the three gradient fields is substantially zero.

19. An apparatus according to claim 17 or claim 18 in which the correction gradient field is applied as two or more corrective components which in total achieve the desired resultant field integral.

* * * * *